(12) United States Patent
Melchior

(10) Patent No.: US 6,473,846 B1
(45) Date of Patent: Oct. 29, 2002

(54) CONTENT ADDRESSABLE MEMORY (CAM) ENGINE

(75) Inventor: Timothy A. Melchior, Colorado Springs, CO (US)

(73) Assignee: Aeroflex UTMC Microelectronic Systems, Inc., Colorado Springs, CO (US)

(*) Notice: Subject to any disclaimer, the term of this patent is extended or adjusted under 35 U.S.C. 154(b) by 0 days.

(21) Appl. No.: 09/596,165

(22) Filed: Jun. 16, 2000

Related U.S. Application Data

(62) Division of application No. 08/970,718, filed on Nov. 14, 1997, now Pat. No. 6,226,710.

(51) Int. Cl.[7] .......................... G06F 13/00; G06F 17/30
(52) U.S. Cl. .................. 711/170; 711/108; 711/216; 711/221; 713/1; 707/100; 707/1; 707/200
(58) Field of Search .................. 713/1, 100; 707/3, 707/6, 7, 1, 100–101, 200; 711/170–171, 173, 108, 221, 216, 104

(56) References Cited

U.S. PATENT DOCUMENTS

| | | | |
|---|---|---|---|
| 4,602,368 A | 7/1986 | Circello et al. ............. 714/718 |
| 4,996,663 A | * 2/1991 | Nemes ....................... 707/200 |
| 5,053,951 A | 10/1991 | Nusinov et al. ............ 711/206 |
| 5,383,146 A | 1/1995 | Threewitt .................... 365/49 |
| 5,423,015 A | 6/1995 | Chung ........................ 711/108 |
| 5,530,958 A | 6/1996 | Agarwal et al. ................ 711/3 |
| 5,568,415 A | 10/1996 | McLellan et al. ............. 365/49 |
| 5,602,764 A | 2/1997 | Eskandari-Gharnin et al. ............ 708/210 |
| 5,615,309 A | 3/1997 | Bezek et al. .................. 706/50 |
| 5,615,360 A | 3/1997 | Bezek et al. .................... 707/6 |
| 5,619,446 A | 4/1997 | Yoneda et al. ................ 365/49 |
| 5,640,534 A | 6/1997 | Liu et al. ..................... 711/146 |
| 5,706,224 A | 1/1998 | Srinivasan et al. ........... 365/49 |
| 5,752,260 A | 5/1998 | Liu ............................. 711/129 |
| 5,761,714 A | 6/1998 | Liu et al. ..................... 711/127 |
| 5,787,458 A | 7/1998 | Miwa ......................... 711/108 |
| 5,796,974 A | 8/1998 | Goddard et al. ............. 712/211 |
| 5,806,083 A | 9/1998 | Edgar ......................... 711/108 |
| 5,960,431 A | * 9/1999 | Choy ............................. 707/7 |

OTHER PUBLICATIONS

IBM TDB, "Hashing Index for Locating Tuples in a Distributed or Parallel Database," May 1993, vol. 36, pp. 259–262.*

* cited by examiner

Primary Examiner—Matthew Kim
Assistant Examiner—Denise Tran
(74) Attorney, Agent, or Firm—Morgan & Finnegan, LLP

(57) ABSTRACT

A content addressable memory ("CAM") engine or controller interfaces between a host signal processor (e.g., a microprocessor) and a plurality of known, commercially-available random access memory ("RAM") devices. The CAM engine configures the RAM as content addressable memory, thereby causing the normally location-addressed RAM to function as CAM. The CAM engine thus allows for the benefits of both RAM and CAM devices, such as speed, density, cost and intuitiveness, without their inherent drawbacks. Further, the CAM engine implements various flexible memory storage configurations for the keys and associations stored in RAM. Also, the CAM engine implements certain algorithms that provide for the hashing of data, for table load and unload capabilities, for proximity matching, for dealing with overflow conditions, and for implementing hierarchical search capabilities.

15 Claims, 10 Drawing Sheets

| Key Width | Association Width | RAM Storage | Notes |
|---|---|---|---|
| 2 to 4 bytes | $2^{AssocWidth}$ bytes | Pointer \| Key <br> Association Word 0 <br> Association Word 1 <br> ⋮ <br> Association Word $2^A$ | Key is up to 32 bits <br><br> Association is $2^{AssocWidth-3}$ 64 bit words |
| 5 to 12 bytes | $2^{AssocWidth}$ bytes | Pointer \| Key b95–64 <br> Key bits 63–0 <br> Association Word 0 <br> Association Word 1 <br> ⋮ <br> Association Word $2^A$ | Key is up to 96 bits <br><br> Association is $2^{AssocWidth-3}$ 64 bit words |
| 13 to 28 bytes | $2^{AssocWidth}$ bytes | Pointer \| Key b223–192 <br> Key bits 191–128 <br> Key bits 127–64 <br> Key bits 63–0 <br> Association Word 0 <br> Association Word 1 <br> ⋮ <br> Association Word $2^A$ | Key is up to 224 bits <br><br> Association is $2^{AssocWidth-3}$ 64 bit words |
| 29 to 60 bytes | $2^{AssocWidth}$ bytes | Pointer \| Key b479–448 <br> ⋮ <br> Key bits 127–64 <br> Key bits 63–0 <br> Association Word 0 <br> Association Word 1 <br> ⋮ <br> Association Word $2^A$ | Key is up to 480 bits <br><br> Association is $2^{AssocWidth-3}$ 64 bit words <br><br> Note: This key width may not be provided in all embodiments of this invention. |

*FIG. 3*

| Key Width | Association Width | RAM Storage | |
|---|---|---|---|
| | | Bank 0 | Bank 1 |
| 2 to 32 bytes | 0 to 32 bytes | Key Word 0 | Association Word 0 |
| | | ⋯ | ⋯ |
| K = ceiling (AssocWidth/8) | A = ceiling (AssocWidth/8) | Key Word $2^K$ | Association Word $2^A$ |

*FIG. 4*

| N | Divisor of Choice | PD | Characteristic | Number of possible associations |
|---|---|---|---|---|
| 7 | $2^N - 1$ | 1 | Prime | 127 |
| 9 | $2^N - 3$ | 3 | Prime | 509 |
| 10 | $2^N - 3$ | 3 | Prime | 1,021 |
| 12 | $2^N - 3$ | 3 | Prime | 4,093 |
| 13 | $2^N - 1$ | 1 | Prime | 8,191 |
| 14 | $2^N - 3$ | 3 | Prime | 16,381 |
| 17 | $2^N - 1$ | 1 | Prime | 131,071 |
| 19 | $2^N - 1$ | 1 | Prime | 524,287 |
| 20 | $2^N - 3$ | 3 | Prime | 1,048,573 |
| 21 | $2^N - 3$ | 3 | 773 = smallest prime factor | 2,097,149 |
| 22 | $2^N - 3$ | 3 | Prime | 4,194,301 |
| 23 | $2^N - 1$ | 1 | 47 = smallest prime factor | 8,388,607 |
| 24 | $2^N - 3$ | 3 | Prime | 16,777,213 |
| 25 | $2^N - 3$ | 3 | 479 = smallest prime factor | 33,554,429 |
| 26 | $2^N - 3$ | 3 | 37 = smallest prime factor | 67,108,861 |

FIG. 7

| Parallel Track 1 | Parallel Track 2 |
|---|---|
| bit 0 =bit 0 + bit N | |
| bit 1 =bit 1 + bit N + bit N+1 + carry bit from bit 0 | |
| bit 2 =bit 2 + bit N+1 + bit N+2 + carry bits from bit 1 | |
| bit 3 =bit 3 + bit N+2 + bit N+3 + carry bits from bit 2 | |
| ... | |
| bit N−1=bit N−1 + bit 2N−1 + bit 2N +carry bits from bit N−1 | |
| bit N =bit 2N + bit 2N+1 + carry bits from N−1 | bit 0 =bit 0 + bit N |
| bit N+1=bit 2N+1 + bit 2N+2 + carry bits from bit N | bit 1=bit 1 + bit N + bit N+1 + carry bits from bit 0 |
| bit N+2 =bit 2N+2 + bit 2N+3 + carry bits from bit N+1 | bit 2 =bit 2 + bit N+1 + bit N+2 + carry bits from bit 1 |
| bit N+3 =bit 2N+3 + bit 2N+4 + carry bit from bit N+2 | bit 3 =bit 3 + bit N+2 + bit N+3 + carry bits from bit 2 |
| ... | ... |
| bit 62−N =bit 62 + bit 63 + carry bits from bit 61 | bit 0 =bit 0 + bit N |
| bit 63−N =bit 63 + carry bits from bits 61 | bit 1 =bit 1 + bit N + bit N+1 + carry bit from bit 0 |
| bit 64−N & 65−N set from carry bits from bit 63 | bit 2 =bit 2 + bit N+1 + bit N+2 + carry bits from bit 1 |
| | bit 3 =bit 3 + bit N+2 + bit N+3 + carry bits from bit 2 |
| | ... |
| bits 0 & 1 − 1 moved to contingency bits | bit N−1=bit N−1 + bit N + bit 2N−1 + bit 2N +carry bits from bit N−1 |
| | bits N & N+1 set from carry bits from bit N−1 |
| if bits 0 to N > divisor, then hash = contingency bits | |
| else hash = bits 0 to N | |

FIG. 9

CONTENT ADDRESSABLE MEMORY (CAM) ENGINE

This is a divisional application Ser. No. 08/970,718 filed Nov. 14, 1997, now U.S. Pat. No. 6,226,710.

BACKGROUND OF THE INVENTION

This invention relates generally to computer memory storage devices and corresponding controllers, and more particularly to a controller for associative memory or content addressable memory devices in which the contents of well-known random access memory ("RAM") devices are retrieved not by use of location addresses, but by use of "keys" associated with the contents of corresponding memory locations.

A computer typically comprises a signal processor, which operates according to defined instructions. The computer also includes a memory storage device that stores the instructions for the signal processor along with data utilized by the processor for various purposes. The most a common type of memory device is RAM, which stores data at particular locations normally defined by specific addresses. To either store or retrieve data in RAM, the signal processor must supply the specific address of the desired memory location to a memory address register associated with RAM. All memory locations within RAM are truly randomly-accessible in that the processor can access any location independently of all other locations in a specific period of time that is constant for all memory addresses.

A RAM device typically comprises a matrix of memory locations arranged by rows and columns. As such, these locations are indexed by row and column numbers. This arrangement of memory locations allows the RAM device to be of relatively high density and low cost. Modern RAM devices are also relatively fast in implementing data storage and retrieval operations. These factors contribute greatly to the large popularity of RAM devices.

With RAM, the number of discrete, addressable locations is essentially limited by the number of address lines provided with the memory device. For example, sixteen individual address lines allow for $2^{16}$, or 65536, separate and distinct memory locations to be addressed within a RAM integrated circuit. Modern commercially-available RAM devices may have at least one million (i.e., "1 Meg") or more of individually-addressable memory locations.

On the other hand, generally the bit size or width of RAM locations varies greatly between commercially-available devices. The width of each memory location is typically determined, in part, by the width (i.e., number of bits) of the data bus employed by the computer system. For example, for a 16-bit wide data bus, the width of a RAM memory location may be 16 bits or may be 64 bits (i.e., four times the 16-bit word size). In the alternative, the word size may be only one bit wide. These sizes are purely exemplary. The word size depends primarily on the chosen application for the RAM device.

RAM devices are generally divided into two categories according to their electrical operating characteristics: static and dynamic. A static RAM ("SRAM") device is constructed internally such that once data have been written into the locations, the logic states of the data are maintained as long as electrical power is applied to the SRAM device. On the other hand, a dynamic RAM ("DRAM") device requires constant refreshing of its internal circuits to maintain the logic states of the stored data in the memory cells over time.

Despite their popularity, RAM devices have inherent limitations. The primary limitation involves accessing stored data using a location-address method. For example, if it is desired to access one specific piece of data, then, for fastest data retrieval, the corresponding RAM location must be known. This requirement stems from the fact that the RAM location address has no logical relationship to the stored data. In RAM, the address is merely an artificial construct. If the specific RAM address is unknown (which is often the case), the processor must employ some type of search process to locate the desired piece of data. With RAM, such searching is typically carried out sequentially, one location at a time.

This sequential searching drawback is magnified in certain software applications that store a large number of items in a data structure such as a table. Many modern software applications are table driven. Software developers have embraced this approach because the resulting software is flexible, understandable and readily maintainable. Generally, these applications consume considerable processor resources. For example, simulation applications are generally table intensive, with a reputation for consuming large amounts of processor time. Unfortunately, this means that the signal processor is spending a great deal of time just finding data entries in the tables.

More specifically, when it is desired to search through, correlate and/or sort a table of data, the signal processor must sequentially scan large blocks of RAM locations to find and/or position certain data during these operations. This serial data processing function is required since a RAM device generally has no capability for scanning, correlating and/or sorting its entire contents in parallel.

For example, in a data table implemented in RAM and containing a list of records (e.g., a list of people), with each record having several data fields (e.g., names, addresses, phone numbers), the signal processor must specify the exact RAM address to find the desired data in the table. Alternatively, the processor could run software that sequentially searches the entire table for a desired field. As compared to a location address, the concept of a "field" has somewhat more of a logical relationship to the stored data. Yet, because RAM generally lacks a parallel scanning ability built into the hardware logic on the RAM device, the signal processor must sequentially search the entire table to locate the desired data. Sequential searching is extremely time-consuming when utilizing RAM devices to store databases. In some simple data capture applications, the tedious implementation of software lookup algorithms represents a significant portion of the application's complexity. The inherent RAM "bottleneck" problem often means that the speed of the RAM device, in storing and accessing data, is the limiting speed factor in the overall computer system. This is becoming more evident as recent speed improvements in signal processors have advanced past speed improvements for memory devices.

As a way of solving the inherent performance penalty associated with the sequential processing of data tables stored in RAM devices, it has long been desired to make memory devices more intuitive in terms of storing and accessing data. That is, it is desired to provide a memory device that functions in more of an associative manner. This is akin to human memory, where stored abstract information is referenced not by addresses, but by some other logically-related abstract information. Ideally, the associative memory should also compare to RAM in terms of speed, cost and density.

Various solutions have been proposed to make computer memory devices more associative in nature while retaining speed, cost and density advantages. These solutions center around both software and hardware techniques. Software schemes for making RAM more associative typically involve such techniques as hashing algorithms, software data structures, databases and neural networks. While these techniques have had some success, they all have a speed cost associated with them, because each associative reference requires many RAM access cycles and, correspondingly, many signal processor cycles. Nevertheless, when utilizing these software techniques, signal processor and memory speed improvements have generally kept pace with application speed requirements.

For example, "hashing" generally refers to software algorithms basically used to store and retrieve data from memory devices. Generally, hashing algorithms randomly scatter data throughout the available memory space using various mathematical functions, such as simple multiply or divide operations. Essentially, hashing is the opposite of the orderly sorting of data in sequential memory locations. The same mathematical function is used to retrieve the stored data. Data stored via hashing can usually be found quicker than data stored in a sorted, orderly manner.

In contrast to these various software schemes that attempt to solve the inherent sequential accessing problem of RAM devices, content addressable memory("CAM") devices are known. Instead of storing data via addressed locations, a CAM comprises a plurality of memory locations accessed by the signal processor using a construct based on the contents of those locations. More specifically, instead of using an address to access a particular memory location, the CAM uses a "key" which contains a portion of the desired contents of a particular memory cell that the processor is looking for. The key itself is also stored in the allocated CAM memory space. Once the desired key has been applied by the processor to the CAM in a data read operation, the CAM will simultaneously examine all of its entries and select the stored data (i.e., the "association") that matches the key. Thus, a CAM contains built-in hardware logic (e.g., a comparator) that performs a parallel search of stored CAM data.

Thus, a CAM is essentially an associative memory that operates more intuitively than RAM, and somewhat similarly to human memory. An associative memory is generally one that allows its stored information to be retrieved based on a partial knowledge of that information. Since the CAM simultaneously scans all of its locations in parallel, a CAM is useful for applications that require the extremely fast location or placement of data. Some exemplary CAM applications include artificial intelligence, pattern recognition, image processing, robotics control, communications networking (e.g., high-speed routers and switches), and arithmetic operations. Essentially, CAM devices find application in any system involving fast look-ups of large tables. CAM devices greatly speed up any application requiring search-intensive and pattern-matching functions. Since a CAM reduces data access time by identifying data by content versus address, any database searching, correlating or sorting operation is made faster by use of such CAM devices.

However, a CAM is not without its inherent drawbacks, despite the fact that it is extremely intuitive and fast. As compared to RAMs, the drawbacks generally involve relatively poor densities and high cost. These particular drawbacks stem from the extra hardware, provided on each CAM integrated circuit, required to perform the parallel search. CAM devices use comparators to find stored data. These comparators typically perform comparison operations on selected bits within the data words to match the provided key with the corresponding association. Because of the complexity of this extra hardware, a CAM integrated circuit is not able to store data at as high a density as a RAM integrated circuit. This means that a smaller number of memory cells can be implemented on a CAM integrated circuit, thereby requiring a larger number of CAM integrated circuits (and a correspondingly larger printed circuit board area) to implement the same size computer memory scheme as with RAM devices.

Other problems with known CAM devices include the facts that since a CAM includes a large amount of extra complex hardware to implement parallel scanning, a CAM generally does not allow for a plurality of tables of different key and association widths and different record capacities. Therefore, if an application desires more than one table with each table having different key and association widths and record capacities, then a separate CAM device is required for each table. Generally, this is not practical from a cost and hardware component standpoint.

Despite these drawbacks, CAM devices still have usage in certain applications, particularly telecommunications. This is because of the inherent speed advantage of CAM, as compared to RAM, when the software application calls for a speed-critical associative look-up of data.

Therefore, what is desired is a hardware approach for implementing a content addressable memory scheme that utilizes the benefits of current RAM and CAM devices, while eliminating the drawbacks of each type of device.

Accordingly, it is a primary object of the present invention to leverage or utilize the inherent speed and intuitiveness of associative memory techniques with the cost and density advantages of random access memories to implement a content addressable memory scheme.

It is a general object of the present invention to implement a CAM controller device or "engine" that transforms conventional RAM devices into CAM devices at the hardware level.

It is another object of the present invention to interface relatively large capacity, low cost RAM devices with a host signal processor through use of a CAM engine.

Still another object of the present invention is to allow for the implementation of data tables, within the interfaced RAM devices, having programmable key widths and programmable association widths for each table.

Yet another object of the present invention is to allow for the implementation of more than one table stored within any one RAM device interfaced to the CAM engine, wherein the multiple tables can have differing key and association widths and differing record capacities.

It is another object of the present invention to provide for relatively rapid (under 100 nanoseconds typical) matching of the provided key to the corresponding stored association.

Another object of the present invention is to provide the CAM engine with bulk table load and unload capabilities, thereby allowing the host signal processor to quickly move a table between disk storage and the interfaced RAM devices.

Another object of the present invention is to allow for rapid direct memory access by the host signal processor of the interfaced RAM devices.

Yet another object of the present invention is to provide for incremental add and delete record capabilities with respect to the data tables stored in the interfaced RAM devices.

It is another object of the present invention to allow for the partitioning of memory devices into multiple tables of various sizes, thereby allowing for the flexible configuration of a relatively large amount of RAM devices into useful segments or records.

Yet another object of the present invention is to provide for hierarchical search capabilities within a plurality of data tables stored within the interfaced RAM devices.

Still another object of the present invention is to provide for proximity match capabilities to locate the closest data associated with the key presented to the interfaced RAM devices.

Another object of the present invention is to provide a memory structure having a pipelined architecture that provides for interaction with the host signal processor in parallel with memory access functions such as adds, seeks and deletes.

Yet another object of the present invention is to provide the CAM engine which off-loads a large amount of duties from the host signal processor in managing a large bank of RAM devices configured as content addressable memory.

Still another object of the present invention is to eliminate the need for custom hardware or software solutions in implementing a content addressable memory.

Yet another object of the present invention is to improve the performance of software applications involving such intensive table-driven data manipulation activities as data storing, correlating and/or sorting.

The above and other objects and advantages of the present invention will become more readily apparent when the following description is read in conjunction with the accompanying drawings.

SUMMARY OF THE INVENTION

To overcome the deficiencies of the prior art and to achieve the objects listed above, the Applicant has invented a CAM "engine" or controller that interfaces between a known, commercially-available, host signal processor and known, commercially-available RAM devices.

In its broadest aspect, the CAM engine or controller of the present invention is a single-chip integrated circuit that interfaces between the processor and a plurality of RAM devices. The CAM engine essentially transforms the interfaced RAM into CAM in terms of data storage and access methodology and functionality. The CAM engine allows the stored RAM data to be rapidly accessed by the interfaced signal processor (e.g., less than 100 nanoseconds) through use of a descriptor (i.e., a "key") that is related to the stored data (i.e., the "association").

The CAM engine also implements certain data storage and retrieval features within the interfaced RAM devices. In accordance with a specific, additional aspect of the present invention, the CAM engine allows multiple database tables of different key and association widths and different record capacities to be configured in a single RAM device.

The CAM engine also implements the related concepts of hierarchical tables and table overflow conditions within the interfaced RAM devices. Specifically, RAM tables can have a parent/child hierarchy of theoretically unlimited depth. When a key is presented to a parent table and no corresponding association is found, the key is then presented to a child table, the key is masked to the length of the child table's key (i.e., the most significant bytes), and a new search for the association is initiated. That search does not stop until a match between the key and association is found, or a no-match condition occurs within a table that does not have a subsequent child table. Thus, tables with different key lengths can be linked together hierarchically and searched in sequence for the most significant bytes of the key.

A second use of this hierarchy feature is for handling table overflows. Specifically, when a table becomes full, the host processor can configure a new table with exactly the same key and association structure and establish it as a child table (i.e., a table subservient to the parent table). The host processor can begin adding records to the newly-established child table, and these records will be located when searching the parent table. This dynamic table configuration feature allows the CAM engine to handle table overflows transparently.

Another aspect of the CAM engine of the present invention relates to the ability of the CAM engine to establish relative and linked associations within the interfaced RAM devices. Relative associations allow for a first bank of RAM devices to be configured to store the "keys", while the "associations" are stored, in the same relative order, in a second bank of RAM devices. The CAM engine keeps the second bank of RAM "primed" (i.e., the CAM engine keeps the rows pre-charged) to allow the association to be read only 10 nanoseconds (for a 100 MHZ implementation) after the key is found. This feature greatly speeds up the search on the key by eliminating the need to read through irrelevant association data.

A further aspect of the CAM engine of the present invention involves a hash algorithm which reduces the time for an original hash and allows for a rehash of every key read. This checks whether the CAM engine has read beyond the end of the possible words in RAM where the key could be stored. The benefit of this feature is that it allows the CAM engine to terminate with a no-match condition as quickly as possible without having to store the hash of each key or to use pointers.

Yet another aspect of the CAM engine of the present invention relates to a proximity match feature that functions to return the stored association data that most closely matches the applied key. This proximity match feature is invoked when there exists no exact identity between stored associations and the applied key.

Still another aspect of the CAM engine of the present invention involves the use of hardware FIFOs (first-in, first-out buffers or registers), that allow the CAM engine to implement a pipelined architecture. The FIFOs allow the CAM engine to essentially perform a co-processor role, freeing up the host signal processor for tasks other than memory management. The FIFOs operate a synchronously with the remainder of the CAM engine integrated circuit to allow the host signal processor to communicate with the CAM engine at a slower rate, while the CAM engine communicates with the interfaced RAM at a higher rate.

Finally, the CAM engine of the present invention implements ancillary features, such as table load and unload, which allow data tables to be quickly moved between the interfaced RAM and external storage devices, such as hard disk drives, where the data can be manipulated by various software applications or utilities.

BRIEF DESCRIPTION OF THE DRAWINGS

FIG. 3 illustrates the concept of linked associations among keys and associations stored in the RAM devices of FIG. 2;

FIG. 4 illustrates the concept of relative associations among keys and associations stored in the RAM devices of FIG. 2;

FIG. 7 illustrates a table depicting information utilized by a hash function implemented by the CAM engine of FIG. 1;

FIG. 9 is a more detailed representation of the algorithm of FIG. 8; and

DETAILED DESCRIPTION OF THE PREFERRED EMBODIMENTS

Figure 1:
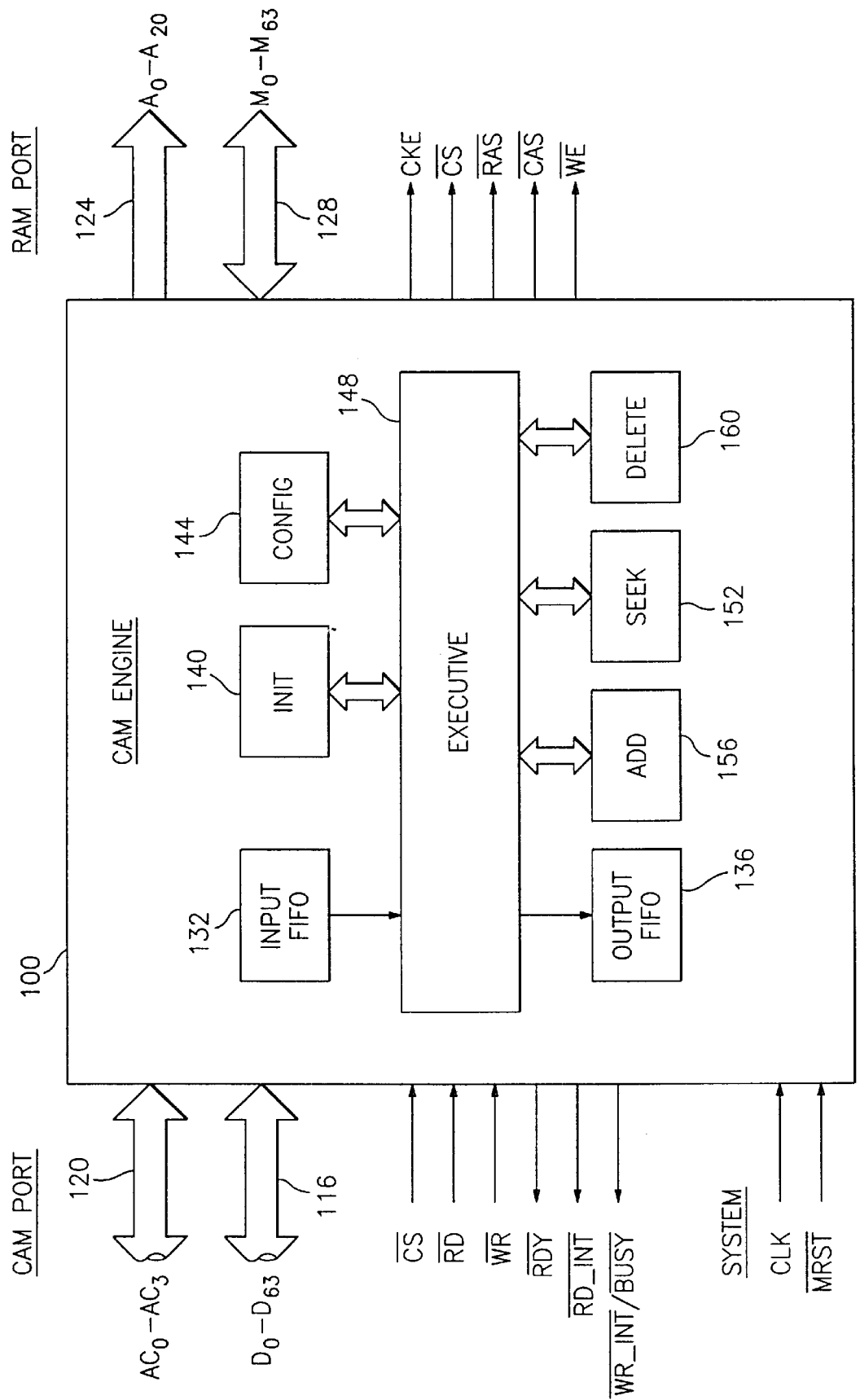
FIG. 1 is block diagram of a preferred exemplary embodiment of the CAM engine of the present invention.

Referring to FIG. 1, there illustrated is a functional block diagram of a preferred exemplary embodiment of the CAM engine 100 of the present invention. As the term is used herein, "CAM engine" essentially refers to a single-chip integrated circuit 100 that functions as a memory controller device. The CAM engine 100 provides for direct memory access of RAM via keys instead of physical addresses. Also illustrated in FIG. 1 are the signal lines that connect the CAM engine 100 with various external components, discussed hereinafter. These signal lines are arranged in three groups: "CAM Port", "System" and "RAM Port".

Figure 2:
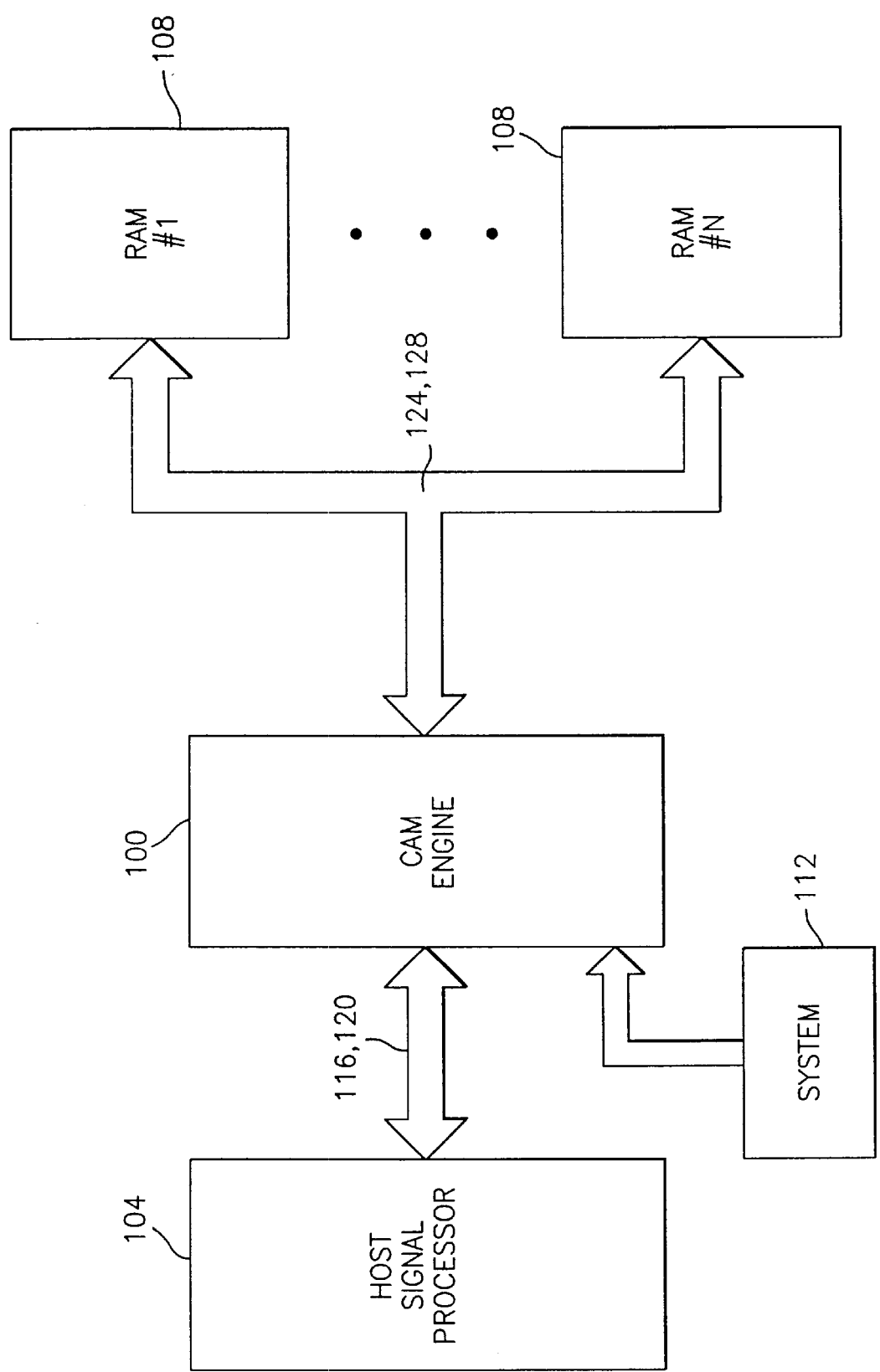
FIG. 2 is a block diagram illustration of the CAM engine of FIG. 1 connected to a host signal processor and a plurality of RAM devices.

FIG. 2 illustrates an exemplary embodiment of the CAM engine 100 of FIG. 1 connected to both a host signal processor 104 (e.g., a commercially-available microprocessor) and a plurality of commercially-available RAM devices 108 ("RAM #1–RAM #N") via the signal lines of FIG. 1. The RAM 108 may comprise static RAM ("SRAM") devices, synchronous dynamic RAM ("SDRAM") devices, or other types of RAM or other memory devices whose storage locations are normally not selected using a construct that is somewhat logically related to the stored data.

The CAM engine also connects with assorted system components 112, such as an oscillator clock circuit. The CAM engine 100 may be directly mapped into the address space of the host signal processor 104, or by utilizing a separate address decoder (not shown) to derive the chip select signal, "CS/" in FIG. 1, for the CAM engine from the host's address bus.

In operation, the CAM engine 100 transforms the RAM 108 into CAM, at the hardware level, in the manner which data are both stored and retrieved in RAM. The RAM 108 stores both keys and associations in tables and returns associations based on keys presented by the processor 104 to the CAM engine 100. This associative manner of identifying stored data for retrieval is in contrast to the usual way RAM 108 is accessed using physical addresses of the RAM storage locations.

Although the contents of the keys could represent some portion of the contents of the corresponding associations, the keys if desired, may contain no part of the contents of the corresponding associations. As such, the keys are still related to the corresponding associations. This is somewhat different from conventional CAMs which have the keys represent a portion of the corresponding associations. Nevertheless, as compared to location addresses, the keys are more logically related to the associations, whether the keys represent a portion of the associations or not.

Even though the CAM engine 100 is disclosed herein as being a separate component from the one or more interfaced RAM devices 108, the present invention contemplates that both the CAM engine circuitry and the RAM cells could conceivably occupy the same integrated circuit component. Similarly, the host processor 104 is disclosed herein as being separate from the CAM engine 100. However, some amount of signal processing circuitry may be implemented on the same integrated circuit as the CAM engine 100, with or without RAM cells also being on. that integrated circuit.

The CAM engine 100 is fabricated using known integrated circuit techniques. In a preferred exemplary embodiment, the CAM engine integrated circuit 100 is based on 0.35 micron technology, and operates at 100 MHZ. With the CAM engine operating at 100 MHZ, host signal processors 104 can operate at speeds up to 100 MHZ. The 100 MHZ clock signal may originate from the oscillator circuit 112 connected to the CAM engine as the "CLK" signal of FIG. 1. At that clock speed, the CAM engine can provide for association matches (i.e., matches between selected stored keys and corresponding stored associations) in as little as 45 nanoseconds when the CAM engine is connected with fast SRAM memory devices. On the other hand, when used with SDRAM and running at 100 MHZ, the association match is typically 85 nanoseconds. These speeds rival those of conventional CAM devices.

The CAM engine 100 interfaces with the host signal processor 104 through a configurable, high-speed, 64-bit, bi-directional data bus 116 ("$D_0$–$D_{63}$"). The data bus 16 facilitates data exchange between the host and the CAM engine. The CAM engine's four-bit command bus 120 ("$AC_0$–$AC_3$") may be connected directly to the lower four bits of the host signal processor's address bus. The command bus 120 communicates fourteen exemplary commands, described hereinafter, from the host 104 to the CAM engine 100. These commands direct the operation of the internal signal processing circuitry of the CAM engine in controlling the interfaced RAM devices 108. The data bus 116 communicates various information between the host and CAM engine, including information regarding the setup and configuration of tables, keys and associations. The remaining external signals connected between the host signal processor 104 and the CAM engine 100 at the "CAM Port" include various unidirectional and bi-directional input and output ("I/O") signals (e.g., "CS/", "RD/", "WR/", "RDY/", "RD_INT/", "WR_INT|BUSY/") that implement various standard control functions associated with an "off-the-shelf" microprocessor, such as chip select, memory read, memory write, ready, read interrupt, and a selectable write interrupt or write busy signal. A clock signal, "CLK", and a master reset signal, "MSRT/", are also provided as inputs to the CAM engine 100 from other system components 112 connected with the CAM engine.

The CAM engine 100 connects to one or more RAM devices 108 through various external signals illustrated in FIGS. 1 and 2 as the "RAM Port". These signals include a 21-bit address bus 124, $A_0$–$A_{20}$", a 64-bit, bi-directional memory data bus 128, "$M_0$–$M_{63}$", and various control signals (e.g., "CKE", "CS/", "RAS/", "CAS/", "WE/") that implement standard control functions associated with "off-the-shelf" RAM devices, such as clock activation, chip select, row address select, column address select and write enable.

All of the I/O signals communicated between the CAM engine 100 and the host 104 are buffered in separate input and output FIFOs 132,136 (i.e., "first-in, first-out" buffers or registers) internal to the CAM engine integrated circuit 100. The FIFOs 132,136 allow the host 104 to communicate commands and data with the CAM engine while the CAM engine simultaneously performs other operations. Thus, the different system components can operate at different speeds from the CAM engine 100. This parallel execution allows for a pipelined system architecture, thereby achieving maximum throughput from the CAM engine 100 without the CAM engine causing a "bottleneck" for the overall microprocessor-based system, as is often the case with RAM devices operating in their standard, location-addressed manner.

The input FIFO 132 buffers commands and data written to the CAM engine 100 by the host processor 104. The commands are executed by the CAM engine in the order presented. The resulting status and data are presented in the output FIFO 136 where they can be read by the host. The FIFOs 132,136 operate a synchronously with the rest of the functional blocks of the CAM engine 100, described hereinafter. This allows the host 104 to communicate with the CAM engine at a slower, more convenient clock rate, if desired, while the CAM engine operates at 100 MHZ. Alternatively, the host processor 104 can operate on the same clock and at the same speed as the CAM engine.

The data bus 116 connected between the host 104 and CAM engine 100 can be configured as either two separate independent 32-bit input and output buses, or as a single bi-directional 64-bit bus. Regardless of the configuration chosen, the RAM 108 is configured in 64-bit data words, in an exemplary embodiment. The bus configuration selection is presented to the CAM engine 100 with the "initialize memory" command from the host processor 104. Upon power up, the CAM engine 100 is initially configured for independent 32-bit buses. Sixty-four-bit architectures present the 32-bit "initialize memory" command in the low order bits which map to the input bus while the CAM engine is configured for independent 32-bit input and output buses.

The CAM engine 100 supports polling or interrupt-driven architectures for the host 104. This allows for flexibility to optimize the host interface architecture and to maximize the throughput of the CAM engine. For polling, the CAM engine can be polled by reading its internal status register. One of the bits returned indicates if there is a completed result in the output FIFO 136. If so, other bits indicate whether the operation was successful or not. Still other bits report an error code if there was an error. In the case of a "seek" command (upon which the CAM engine seeks a key and corresponding association stored in RAM 108 based upon a key presented by the host to the CAM engine), the status register can be polled until it indicates completion. If the status bit indicates success, then a "read data" command can be executed by the CAM engine to return the association to the host 104.

On the other hand, an interrupt pin ("RD_INT/") on the CAM engine 100 can be used in interrupt-driven architectures to cause an interrupt to occur when output data becomes available in the output FIFO 136. This can be either a pulse or a level signal. After responding to the interrupt with a read, the CAM engine automatically resets the interrupt.

The binary logic states of the signal lines of the four-bit control bus 120, $AC_0$–$AC_3$, define fourteen separate commands communicated by the host signal processor 104 to the input FIFO 132 of the CAM engine 100, in a preferred exemplary embodiment. Twelve of these commands define RAM setup and management operations carried out by the CAM engine. The remaining two commands allow the host processor 104 to retrieve information from the output FIFO 136 of the CAM engine.

The fourteen commands include "initialize memory", "configure new table", "set hierarchy", "set context to existing table", "delete table", "unload table", "load table", "count records", "add record", "delete record", "seek (exact match)", "seek (proximity match)", "read status" and "read data".

The first command the host signal processor 104 sends to the CAM engine 100 is the "initialize memory" command. This command includes information that identifies the type (i.e., SDRAM or SRAM) and size (i.e., number of 64-bit words) of interfaced RAM 108 available to the CAM engine. This information is contained within certain bits off a word on the data bus 116. Other information on the data bus 116 associated with this command includes the number of SDRAM banks, the number of tables allowed, the bus width (i.e., separate 32-bit input and output buses, or a single, 64-bit, bi-directional bus), and the interrupt type (i.e., pulse or level). The overall size of RAM 108 connected to the CAM engine 100 can be any power of two from $2^{10}$ to $2^{32}$. This gives the CAM engine the flexibility to drive from 8 k bytes to 256 gigabits of RAM.

When the CAM engine 100 receives the "initialize memory" command, the initialization function 140 illustrated in FIG. 1 is invoked. This function 140 is essentially an algorithm or sequence of steps carried out by signal processing circuitry within the CAM engine integrated circuit 100. Some of the specific exemplary tasks implemented in the initialization function 140 include allocating an area in memory for storing table configuration data and zeroing these memory locations in RAM 108. Also, all "on-chip" CAM engine configuration variables are cleared and the control data are setup depending upon the number of permitted RAM configurations.

For example, RAM 108 may be configured in either a single-bank or a two-bank configuration. In a two-bank configuration, the first two words of the configuration area are set to contain the size of the free block in the upper 32 bits, while a zero forward pointer is set, in the lower 32 bits, to indicate no more free blocks in the bank. On the other hand, a single-bank configuration may be chosen when external memory does not support multiple banks, or for deep table configurations with large associations, or when all of the tables are linked associations. Depending upon the table configuration chosen, more RAM storage might be usable in a single-bank configuration. In a single-bank configuration, the entire available RAM 108 is configured as bank zero, while the bank one free pointer is set to zero to indicate there is no free space in bank one. Within either a single-bank or two-bank configuration of RAM 108, various table configurations are possible.

In embodiments of the CAM engine 100 that support only a single table configuration, the configuration function 144, illustrated in FIG. 1, is invoked upon completion of the initialization function 140. This function sets the CAM engine to a predetermined configuration. In contrast, for embodiments of the CAM engine that support multiple table configurations, the configuration function 144 is invoked as a result of a specific configuration request from the host 104.

For example, if the host 104 sends a "configure new table" command to the CAM engine 100, the configuration function 144 uses the executive function 148 of FIG. 1 to check if the new table specified is already in use. If so, this is an error that is reported to the executive function 148. If the specified new table is not already in use, the new table configuration is setup using the contents of certain bits of the data bus 116 specified by the host 104. Specifically initialized are various local variables, such as the depth of the new table, the key and association widths, the hash factor, the prime delta, the hash shift, and the base addresses for the key storage and association storage.

The CAM engine 100 may implement various possible table structures in RAM 108. In a preferred exemplary embodiment, the CAM engine, upon request from the host 104, may partition RAM into a single CAM table, or into as many as 8096 independent, uniquely-configured CAM tables. The tables may have different record capacities. This large number of independent tables supports multiple software application processes and allows a single process to manipulate multiple tables. The resulting depth, width and number of tables is dependent upon the total size of RAM 108 and the ultimate user configuration.

The tables store both keys and associations. Regardless of table size, each table has a programmable key width which may vary from 2 to 32 bytes (256 bits) in length. The key width is specified when a new table is configured. Different CAM tables can have different key widths, giving application designers considerable flexibility. The association word width is also programmable from 1 byte to 8 megabytes (up to $2^{20}$ 64-bit words). The association width is also specified when a new table is configured. Different CAM tables can be configured with different association widths. Any combination of key widths, association widths and table sizes may be utilized within the constraints of the RAM devices 108 chosen to-interface with the CAM engine 100 of the present invention.

The 8096 tables can be independently configured to 360 different combinations of key widths and association widths. Tables can be sized to 15 different depths with record capacities ranging from as few as 64 records to as many as 32 million records. The record depths allocated for a given table are expressed as an exponent of two. Tables can be sized from $2^9$ to $2^{26}$ records. The key width, association width and record capacity table parameters are specified by the logic states of certain bits within a 64-bit data word transmitted over the data bus 116 to the CAM engine with the "configure new table" command.

The RAM storage layout is determined based upon the key width, association width, and an "extra wide table" Boolean. The "configure new table" command causes the CAM engine to automatically configure RAM storage for optimal performance. The algorithm for selecting the record layout, discussed hereinafter, prevents the CAM engine from unnecessarily reading associations in its burst read search through consecutive words containing keys. The general rule for determining the number of 64-bit RAM words required for each record is shown in the following pseudo code snippet:

if(ExtraWideTable)WordsPerRecord=$2^{KeyWidth}$+ceiling (KeyWidth/8);
    else if((KeyWidth+AssocWidth)<9)WordsPerRecord=1;
    else if(KeyWidth<9)WordsPerRecord=1+ceiling (AssocWidth/8);
    else if((KeyWidth+AssocWidth)<17)WordsPerRecord=2;
    else if(KeyWidth<17)WordsPerRecord=2+ceiling (AssocWidth/8);
    else if((KeyWidth+AssocWidth)<33)WordsPerRecord=4;
    else WordsPerRecord=4+ceiling(AssocWidth/8);

Generally, application performance is a function of the packing density of the tables. It is recommended that tables be limited to seventy-five percent packing density to maintain good performance. All totaled, there are 6480 different CAM table configurations possible with the preferred exemplary embodiment of the CAM engine 100 of the present invention. This flexibility allows for development of sophisticated content addressable databases.

The CAM engine 100 may create virtual CAM tables within RAM 108. This feature allows software applications to utilize the interfaced RAM for multiple purposes and to manage RAM resources dynamically. The ability to scale applications is also an important flexibility of the CAM engine. The performance characteristics of tables with different record capacities are virtually identical. Thus, an application can respond to increases in data volume without impacting CAM engine performance. This allows for new generations of CAM applications to maximize reuse of previous architectures.

The CAM engine 100 supports two types of RAM table widths: normal tables and extrawide tables. The types differ in the way associations are represented and the way tables are internally managed. A Boolean indicator, presented by the host 104 as part of the 64-bit data word in conjunction with the "configure new table" command, identifies the table type. The valid association widths for normal tables range from 0 to 32 bytes. One of these 33 widths must be specified when a new normal table is configured.

Validation lists are defined when an association width of zero is specified. In the case of such tables, no association is returned by the CAM engine 100 in response to a "seek" command from the host 104. Instead, only the status bit is set to indicate if key exists in the table.

The valid association widths for extra-wide tables range from 0 to 23. This number represents an exponent of 2 that indicates the number of bytes in the association. Thus, the possible association widths for extra-wide tables range from $2^0$ through $2^{23}$ bytes. One of these 24 widths must be specified when an extra-wide table is configured. The distinguishing characteristic of extra-wide tables is that the association storage is not acquired until a record is added and released for possible use by other tables when a record is deleted. While extra-wide table configurations are a little slower than normal tables, they are especially useful when associations are very large, such as a bit map.

For a "configure new table" command, the CAM engine also configures the table depth in terms of number of records. The table depth may take on one of 18 different values, ranging from a record capacity of approximately 64 records up to 32 million records. The RAM layout or configuration is determined by the specified key width and association width. A configuration is automatically selected to minimize the number of key words that need to be read for a seek. This can be adjusted for the word width employed in the particular embodiment of the invention.

When the CAM engine receives a "configure new table" command from the host 104, the key and association widths requested are checked for validity. Next, if an extra wide table is requested, a table is configured for 1, 2 or 4 words of primary table record width after allowing for the key and a 32-bit linked association pointer. An area just large enough for the association is allocated as each record is added, and de-allocated as the record is deleted. Thus, only the amount of memory required to actually store associations is used. This is the concept of linked associations, several examples of which are illustrated in FIG. 3.

When the key and association fit together in 1, 2 or 4 words, without increasing the number of words read to search for the key, then the key and association share the primary table area record. This is the concept of embedded associations.

If an extra wide table is not requested and if the key and association fit into a single word, then a single word embedded association table type will be selected and both the key and association will be stored in the primary table area. Otherwise, if the key fits in a single word, then the key is stored in a single word per record in the primary table area and the association will be stored in 1, 2 or 4 words (as needed) in the secondary table area. If two banks of RAM are employed, then an attempt is made to place this secondary table area in the second RAM bank. This allows the appropriate row in the second table to be primed while the key is searched for in the first bank. This is the concept of relative associations, as illustrated in FIG. 4.

If neither of these cases are true, the same rules are applied for 2 and 4-word key widths until the optimum table configuration is selected.

Other local variables initialized upon receipt of the "configure new table" command include the hash factor, which is the number of key bits per hash iteration. This variable is set from the size ROM ("Read Only Memory") table indexed by table size. The hash algorithm is described in detail hereinafter. The prime delta variable is similar in that it is also set from the size ROM table indexed by table size. This variable indicates if the hash function uses minus 1 or minus 3. The hash shift variable indicates the number of bits to shift hash left to index the key in RAM. If the key width is greater than 3, the hash shift variable equals zero. Otherwise, the hash shift equals the key width.

For example, for table sizes beginning at 0 and incrementing by one until 14 (as indicated by certain bits in the data word on the data bus 116), the corresponding hash factor is 7, 9, 10, 12, 13, 14, 17, 19, 20, 21, 22, 23, 24, 25 and 26, respectively, while the prime delta is 1, 3, 3, 3, 1, 3, 1, 1, 3, 3, 3, 1, 3, 3, and 3, respectively.

The key base register describes the base address for storage of the key in RAM, while the association base register describes the base address for storage of the association in RAM. The key base and association base are both read from the configuration section for a reconfiguration or is set after memory allocation for a new configuration.

The configuration data for the first few tables are kept in registers. The number of such tables depends upon the particular implementation, but eight is a likely number. The purpose of this is to allow rapid context switching between the most frequently used tables. The configuration data for the remaining tables are kept in the off-chip memory area allocated for this purpose by the "initialize memory" command.

When the CAM engine 100 receives the "configure new table" command, the key and association storage space is allocated. Initially, the executive function 148 of FIG. 1 is invoked to allocate $64+2^{(HashFactor+PrimaryTableWidth)}$ words of storage where $2^{PrimaryTableWidth}$ is the number of words or primary table area storage per record. The primary table area stores the key and pointer for linked association table types, the key and association for embedded association table types, and the key alone for relative association table types. For relative association table types, the executive function 148 of FIG. 1 is further invoked to allocate $64+2^{(SecondaryTableWidth)}$ words of storage where $2^{SecondaryTableWidth}$ is the number of words of storage required for the association. The additional 64 words in either case are included to accommodate a potential hash heap extending beyond the greatest hash address for the given table size. The number of words needed to store the primary table records is calculated by the following C code snippet:

PrimaryTableStorage=1<<(HashFactor+PrimaryTableWidth);

The primary table storage is always requested from bank zero. The executive function 148 will allocate space in bank zero is possible. If no bank zero space is available, but space is available in bank one, the executive function will allocate space in that bank without returning an error. If the executive function indicates success, the register "key base" is set to the address returned. Otherwise, the configuration is terminated.

If the table is a relative association type (FIG. 4), the above process is repeated for the association storage. This time, RAM is requested from bank one, but bank zero might be substituted if necessary. The calculation of association storage is accomplished in the following C code snippet:

WordsOfAssocStorage=64+(1<<(HashFactor+AssocWidth));

If the executive function 148 indicates success, the register "association base" is set to the address returned. Otherwise, the configuration is terminated. Both the key base and the association base are stored in the first word of the context entry for the table. A one is stored in the first word of the key storage. The remaining words are initialized to zero.

When the CAM engine 100 receives a "set context to existing table" command from the host signal processor 104, the CAM engine identifies the RAM table which currently has context. Generally, this command must be performed after the "configure new table" command and before any record operations can be performed on that table. Also, this command must be called to change the context to perform record operations on a different table.

Upon receiving the "set context to existing table" command, the CAM engine checks whether the table number specified exceeds the valid limit for the particular embodiment. If so, the executive function 148 in FIG. 1 is invoked to report an error and the command processing is terminated. If not, the executive function 148 is invoked to read the two configuration words stored in RAM or registers and into global registers. If the contents of the second word are zero, then the table specified on the data bus has not been previously set. If so, the executive function is invoked to report an error and the command processing is terminated. Otherwise, the configuration function 144, described above with respect to the "configure new table" command, with regard to the initialization of local variables, is followed. However, the local variables "key base" and "association base" are set from the first word read from the CAM table's configuration records.

The CAM engine 100 responds to a command from the host signal processor 104 to "set hierarchy". The CAM engine defines a parent/child relationship between two tables, implemented in RAM, in preparation for hierarchical searches. The hierarchical search capability allows tables with different key lengths to be linked hierarchically and searched in sequence for the most significant bytes of the key. This feature also allows tables to be dynamically expanded if a table overflow occurs. In this case, the same key lengths are used for both the parent and the child tables.

The CAM engine 100 implements a simple hierarchical search capability which supports a longest prefix match. A CAM table implemented in RAM 108 (i.e., a "parent" table) may optionally be designated as having another specific table as a "child". Association searches which fail to find an exact match for the key in the parent table automatically cascade to their child table, if one has been designated.

Figure 5:
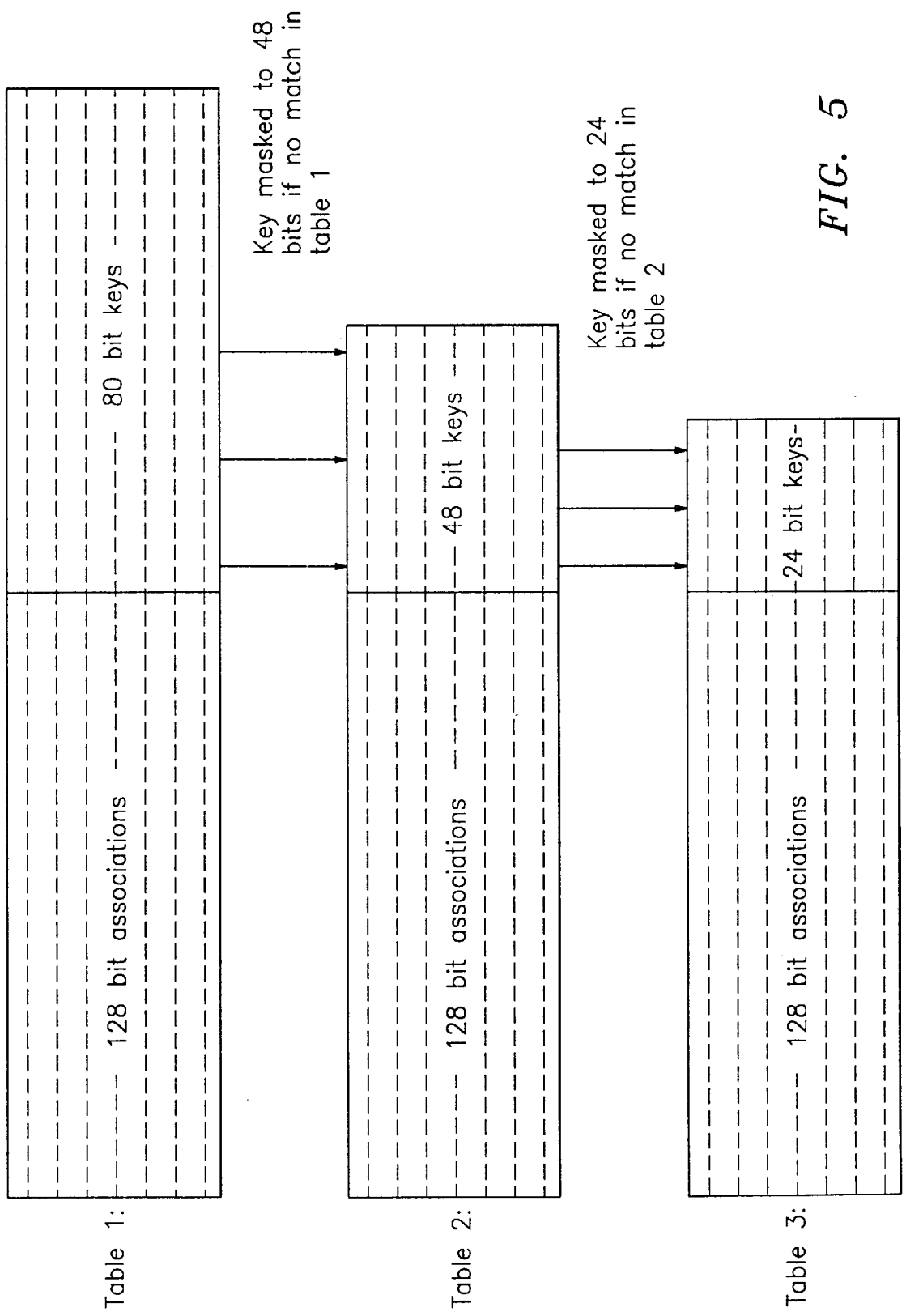
FIG. 5 illustrates the concept of the hierarchical table implementation and search function implemented by the CAM engine of FIG. 1.

FIG. 5 illustrates an example of this concept using three tables, each table having 128-bit association widths, table 1 having an 80-bit key width, table 2 having a 48-bit key width, and table 3 having a 24-bit key width. The key being searched for is automatically masked to the length of the key of the child table, thereby preserving the high order bytes of the key. The child table (table 2) is searched and, if an exact match is not found and the child table has another subsequent child table (table 3), the CAM engine automatically cascades to the new child table and the search process is repeated. As soon as a match is found in a child table, the corresponding association is returned. If an exact match cannot be found in any hierarchical tables, the CAM engine will return a no-match status.

This hierarchical table structure and search capability is especially useful for telecommunications applications. Considerable time is saved by not having to pass the no-match condition out of the CAM engine, the host processor having to decide what to do with such condition, and having to present a context switch and the key back to the CAM engine.

Figure 6:
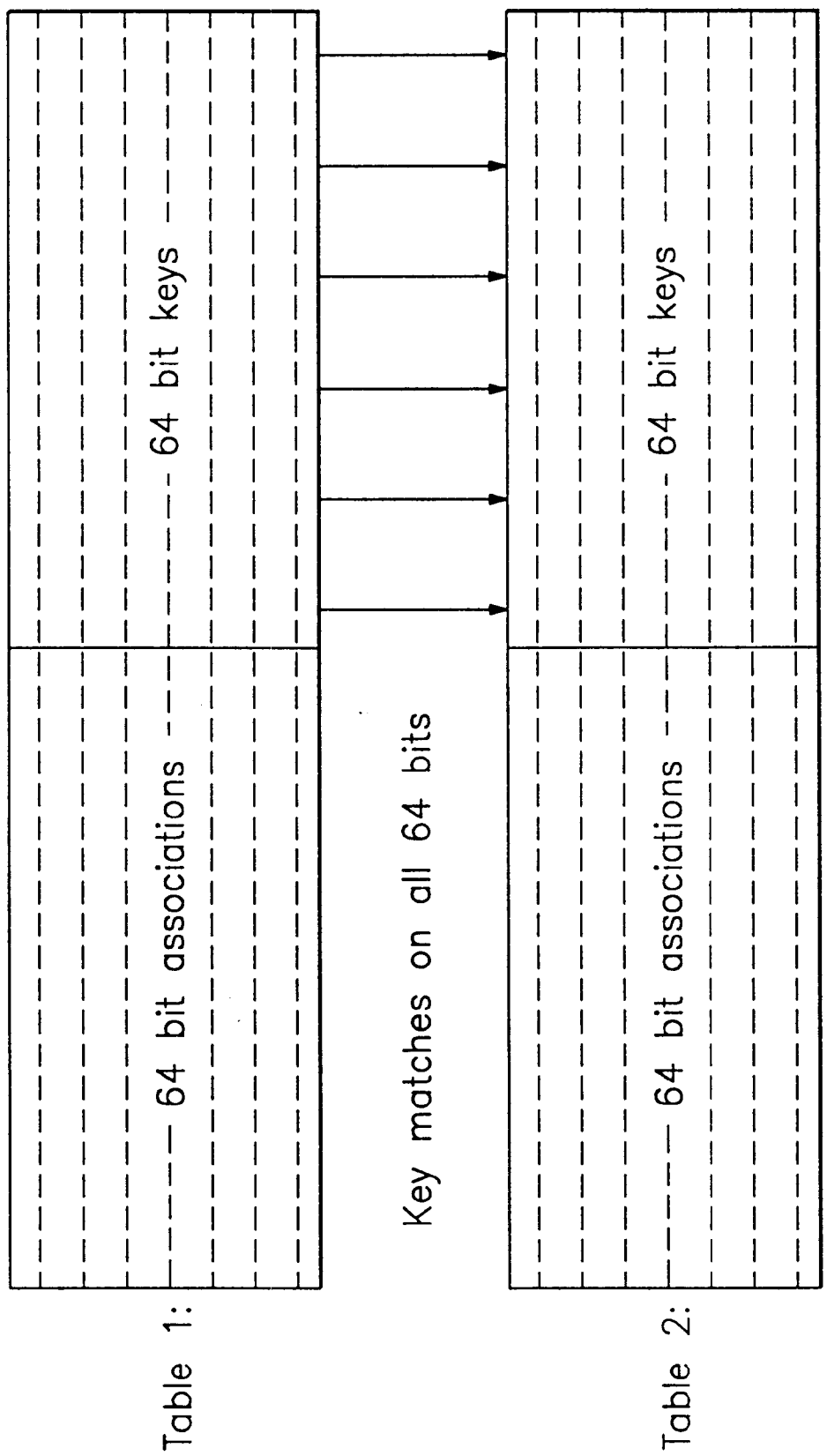
FIG. 6 illustrates the concept of table overflow implemented by the CAM engine of FIG. 1.

In addition to supporting a prefix match, the hierarchy feature also provides the general data management function of table overflow control. Sometimes, data capture applications cannot properly size a table to handle all possible circumstances. When an application determines that a table has reached its storage capacity, a new table with the same key and association lengths can be created and set as hierarchically subservient to the original table. New records can be added to the newly-created table and seeks can continue to be performed against the original table. At a slight cost in performance, the application can continue to run without any awareness that a table has gone into overflow mode. Thus, overflow conditions are handled transparently. This is in contrast to conventional CAMs, where if a table fills up, records must be removed before a new record can be added. FIG. 6 illustrates this concept of table overflow, in which the original table, table 1, has overflowed into table 2.

The "set hierarchy" command is optional, and can be performed at any time after the parent and child tables have both been configured. Also, it can be performed at any time to redefine a parent/child relationship. The command has no effect until context is set to a table defined as a parent.

The CAM engine configuration function 144 of FIG. 1 responds to a "delete table" command from the host 104. For this command, the CAM engine 100 simply deletes the entire table specified, along with all of its records. If the table is an extra wide table, then all linked associations are deleted. Note, this command is different from the "delete record" command, discussed hereinafter.

The CAM engine 100 responds to a "count records" command from the host 104. This feature assists the software application to determine if a table is full and whether it needs to take corrective action. The CAM engine counts the number of records in the table which currently has context, and returns the count to the host. In taking the corrective action, the application might delete old records, create an overflow table or restructure or re-size the table. This might be useful for periodic monitoring of CAM tables to determine if a table is becoming full and if corrective action should be taken. This command may be performed any time after the appropriate table has had context set to it.

The CAM engine 100 of the present invention implements table load and unload features in response to "load table" and "unload table" commands, respectively, from the host 104. These features work together with software database programs to support database maintenance functions such as backup and recovery, and table and database restructuring.

For example, it is often desirable to periodically back-up a table. Also, it is desirable to restore a backed-up table without having to perform successive add-record operations. It may also be desirable for some applications to initialize a table to a previously determined set of values. The table load and unload features allow applications to easily load and unload CAM tables to and from RAM 108.

Also, tables for entire databases can be restructured to de-fragment memory or to combine tables which have gone into overflow. The CAM engine 100 supports these activities by allowing tables to be unloaded from RAM 108 to the host 104, then manipulated by a database utility program, and reloaded into RAM back from the host. These two commands can be performed any time after the appropriate table has had context set to it.

If a "unload table" command is requested, the CAM engine will first output its configuration word to the data bus. Then, beginning with word zero, the CAM engine will sequentially output each RAM word within the range of the configuration. A handshake with the application will accompany each word. A time-out waiting for a handshake from the application will result in an error and terminate the unload. Upon completion of the unload, the CAM engine will invoke the executive function 148 to set the status bit to indicate that it was successful and that the unload was complete.

If a "load table" command is requested, the configuration must exactly match the configuration of the table previously unloaded. The current configuration word is compared with the word on the data bus. If they are not equal, the executive function 148 will be initiated to flag the error and terminate the load. Otherwise, the CAM engine will store each word passed in the load in consecutive words of the current table. The handshake and time-out logic is the same as the unload. If a time-out occurs during a load, the table is reinitialized. When successfully completed, the original contents of the table are entirely replaced by the load and the CAM engine 100 will invoke the executive function 148 to set the status bit to indicate that it was successful and that the load was complete.

Similar to the other functional blocks illustrated in FIG. 1 as being part of the CAM engine 100 of the present invention, the executive function 148 comprises signal processing circuitry within the CAM engine integrated circuit. The executive function performs such tasks as RAM management, control and refresh, data bus management, status and error reporting, and performance monitoring. The RAM management function allocates free RAM space and returns deleted table space to the RAM free space pool. The requesting function specifies the number of words required and provides a Boolean variable indicating which RAM bank is the first choice. RAM allocation is performed using a simple first fit algorithm. The chain pointer for the bank requested is walked until a free block large enough to accommodate the request is found. If such a block does not exist in the bank requested, then allocation from the other bank is attempted. If neither bank has sufficient free space, an error is reported. On the other hand, RAM release is performed by absorbing the released block into free blocks on either side of it, if possible, or by adding the block to the free chain. In either case, RAM is not zeroed wren released. It is zeroed when allocated for key portions only.

The RAM control function provides RAM read and write services for all other CAM engine processes. The address, a read/write flag, and burst length are provided when the service is requested. The RAM control function also handles requests to terminate a burst read. A gate is set by the function while it has control of the RAM. If a RAM refresh is underway, the RAM control function will wait.

The RAM refresh function counts clock cycles and, depending upon the clock speed, initiates a standard distributed CBR refresh as soon as the RAM is not busy and the appropriate number of cycles have passed. This executive process is performed in parallel with all other CAM engine processes and communicates via a gate with the RAM control function to show that the RAM is busy during the refresh cycle.

The executive function 148 of FIG. 1 also controls all chip I/Os. This includes the I/O through the bi-directional host data bus 116 and the bi-directional memory bus 128.

All host write commands are buffered through the input FIFO 132 by a FIFO manager, which is part of the executive function 148. From the input FIFO, the FIFO manager initiates modules to perform specific tasks. Each module returns a status to the report status module of the executive function 148 and returns data into the output FIFO 136 along with the status data provided by the report status module. The FIFO manager responds to the host read commands by providing status and data from the output FIFO 136 onto the host data bus 116.

The CAM engine 100 of the present invention implements a hash algorithm to determine the optimum location in RAM 108 to store data and to determine where data are stored in RAM.

The hash algorithm hashes keys presented on the data bus 116 by the host 104 to the CAM engine. Key hashing is performed, for example, in response to the "seek (exact match)", the "delete" and the "add record" commands, described hereinafter. The hash algorithm is also used to rehash keys read from RAM to determine the depth of consecutive words in RAM that share the hash code of interest.

In a preferred exemplary embodiment, the CAM engine 100 of the present invention employs various different hash algorithms, including a base 10 modulus hash and several fast hash algorithms. The hash algorithm selected must be specified when a table is configured and is used for all hash interactions for that table. This allows a user to select the hash algorithm which performs best with a particular set of data. While the full modulus hash (i.e., base 10 hash) algorithm takes longer to calculate than the fast hash algorithms, it may produce a better distribution.

The base 10 modulus hash function generates a hash code by calculating the modulus of a prime or "near prime" number just slightly smaller than the address space of RAM being addressed. The hash code can be calculated using the following equation:

for integers KEY, N and PD where $2^N$>PD;

KEY mod $(2^N-PD)$=((KEY mod $2^N$)+((integer(KEY/$2^N$)*PD))) mod $(2^N-PD)$

This property allows the normally time consuming modulus function to be simplified into a number of shifts, additions and a subtraction. N and PD are constants set upon initialization of RAM. N is selected so that $2^N$ equals the number of target addresses available. For the address spaces of interest, PD=3 or PD=1 were selected because for these address spaces, either $2^N-3$ or $2^N-1$ has the desirable characteristic of being either prime or having its smallest prime factor>20. Numbers divisible by less than 20 are generally not suitable as the divisor for a hash modulus. The table of FIG. 7 illustrates the divisor of choice for the address spaces $2^N$ supported by the CAM engine. PD represents the prime delta used by the modulus hash function.

The following C code snippet illustrates how the hash would be performed for a 64-bit key if high level functions were utilized:

```
void CCAMDig::OnHashHighLevel(unsigned_int64 key,
unsigned_int32 addressBits)
{
    unsigned_int32 hash
    hash=unsigned_int32(key % (pow(2, addressBits)-PD));
}
```

The following C code snippet more closely represents the hardware implementation of the high speed modulus algorithm for a 64-bit key using only low level functions:

```
void CCAMDig::OnLowLevel(unsigned_int64 key,
unsigned_int32 addressBits)
{
    unsigned_int64 temp;
    unsigned_int32hash divisor;
    int highBits, is;
    highBits=64-addressBits
    if (PD=3) is=2 else is=1;
    divisor=(0xFFFFFFFFFFFFFFFF<<highBits>>highBits)<<is>>is
    temp=(key<<highBits>>highBits)+(key>>addressBits)+
        (key>>addressBits<<1);
    temp=(temp<<highBits>>highbits)+(temp
        >>addressBits)+(temp>>addressBits<<1);
    hash=unsigned_int32((temp<<highBits>>highBits)+
        (temp>>addressBits)+(temp>>addressBits<<1));
    if (hash>=divisor) hash=(hash & 0x3)-1;
}
```

Figure 8:
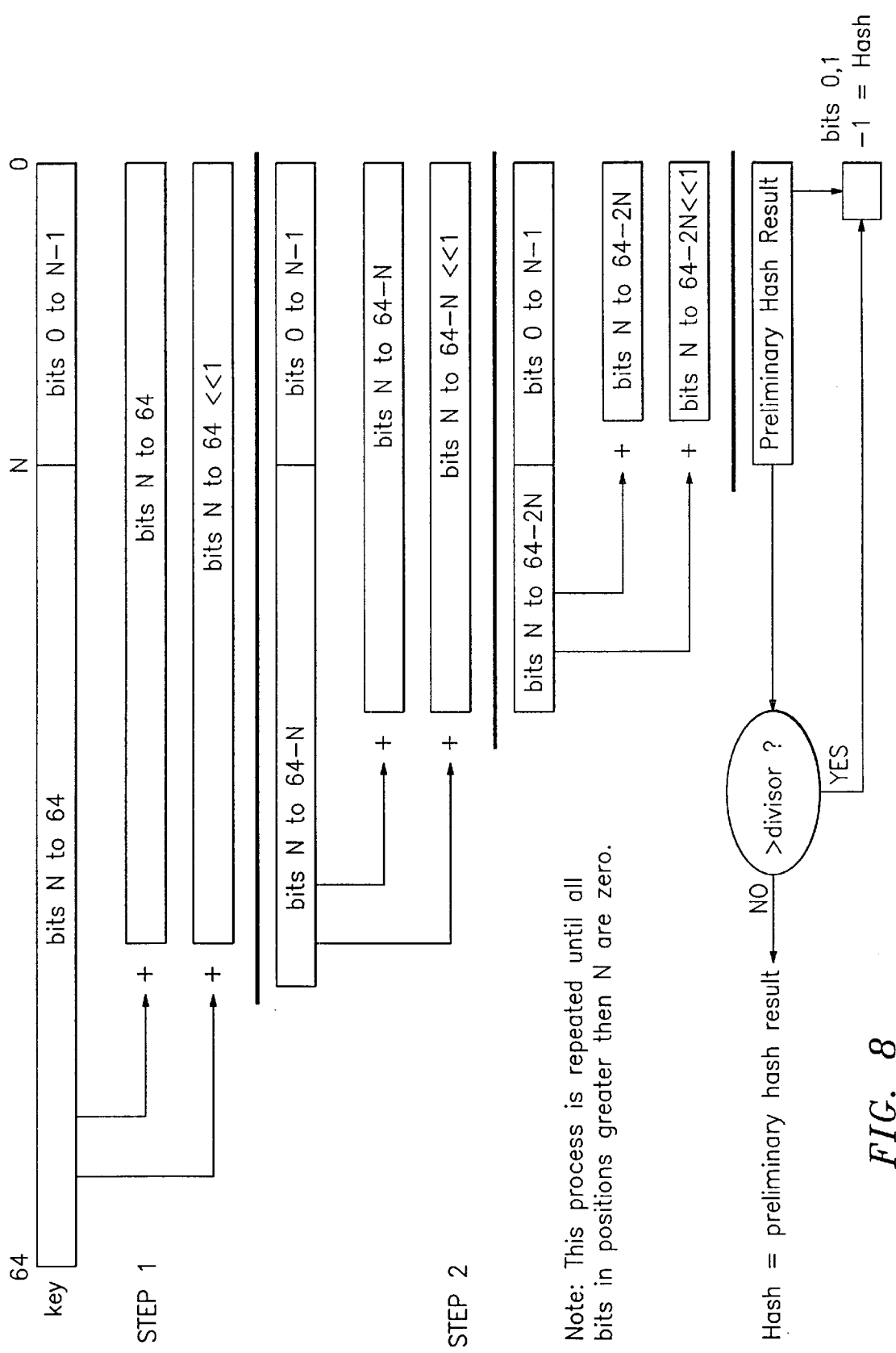
FIG. 8 is a graphical illustration of a hardware implementation of a hash algorithm implemented by the CAM engine of FIG. 1.

The final modulus is performed by a single conditional subtraction to properly compute the modulus for the cases $2^N-1$, $2^N-2$, and $2^N-3$. The actual hardware implementation is depicted graphically in FIG. 8 for a 64-bit key. FIG. 9 is a table depicting a more detailed representation of the hash algorithm. In FIG. 9, once step 1 has completed processing bit N, step 2 can begin to run in parallel. Similarly, once bits 0 and 1 of the preliminary hash result are available, they can be extracted and made ready in case they become the final hash.

For shallow CAM tables and/or long keys, additional parallel processes can be employed to speed the hash calculation. In these cases, the pattern above is followed for each successive N bits of the key. Approximately, the number of parallel processes that can be effectively utilized is roughly represented by the formula:

NumParallelProcesses=Integer(NumKeyBits/N)

In the actual silicon implementation of the hash algorithm, logic is employed to ensure that a process is never overtaken by a chasing process and additional parallel processes are automatically initiated as soon as the preceding N bits of the key have been processed.

As an alternative to the base 10 modulus hash, several fast hash algorithms allow the hash to be performed synchronously with each RAM read. These algorithms are variants of base two modulus functions which differ by the bit alignment as a series of exclusive or operations are performed. An unequal frequency distribution of certain key bits can be compensated for by selecting the best alignment factor. The following code snippet illustrates the fast hash algorithm for a 256-bit key. The particular algorithm is determined by the input ALIGNMENT.

val=(Key64[0] & KeyMask[0])^ (Key64[1] & KeyMask[1])^ (Key64[2] &
    KeyMask[2])^ (Key64[3] & KeyMask[3]);
    hash=unsigned__int32((val>>31)^ (val<<33>>33));
    hash=(hash>>((TableSize-ALIGNMENT)))^ (hash<<(64-TableSize)>>(64-TableSize));
    hash=(hash>>TableSize)^ (hash<<(64-TableSize)>>(64-TableSize));
    hash=(hash>>TableSize)^ (hash<<(64-TableSize)>>(64-TableSize));

The fast hash function can hash up to 1024 bits of key in 10 nanoseconds using modern CMOS technology. The 10 nanoseconds is critical because it is synchronously hashing in single clock cycles running at 100 MHZ. This allows for an original hash and allows for the rehash of every key read to see if a read has occurred beyond the end of the possible words where the key could have been stored. The benefit of this is that it allows the CAM engine to terminate with a no match condition as quickly as possible without having to store the hash of each key or use pointers.

The CAM engine 100 also responds to a "seek (exact match)" command from the host signal processor 104. In response to this command, the CAM engine attempts to return the stored association of the record indexed by the key presented by the host in the table which currently has context. In other words, the CAM engine is looking for an exact identity between the key presented to it and a key mapped to an association stored in RAM.

In a preferred exemplary embodiment, the CAM engine's seek time is optimized by utilizing parallel processes not only for the seek function 152 of FIG. 1, but also for the add function 156 and the delete function 160 of FIG. 1, both discussed hereinafter. By reading, comparing, checking for free words and checking for the end of the hash heap all in parallel, the CAM engine of the present invention can sustain a 10 nanosecond per word read rate. This rate can actually be achieved for very wide word widths.

The parallel processes involve calculating the hash (seek) key and the segment base address, and reading the key words starting at the address just calculated. The CAM engine then checks for an exact matcher between the key presented and the stored key, while simultaneously performing, in parallel, a rehash of the key just read and a check for a no match condition. This parallel seek process continues until either a match condition or a no match condition is met.

When either condition is met, all of the parallel processes are terminated. A check for a no match process checks if the hash code just calculated is greater than the hash code calculated from the target key, and, if so, the executive function 148 of FIG. 1 is invoked to set the status to no match and to terminate the burst read. The add function 156 of FIG. 1 ensures that heaps of keys with common hash codes are stored contiguously and follow any keys with lesser hash codes.

A check for a match checks if the words just read match the seek key and, if so, then the executive function 148 is invoked to begin the transfer of association data, to set the status to match, and to terminate the burst read.

The CAM engine 100 of the present invention is designed to leverage the burst read and write capability of synchronous dynamic RAM ("SDRAM") and of pipelined Static RAM ("SRAM"). SDRAM burst read and write allow the reading of consecutive words in RAM at the rate of one word per clock cycle (as fast as 10 nanoseconds in current SDRAMS). In the CAM engine, the storage algorithm, as part of the hash algorithm, keeps all hash collisions in contiguous RAM, thereby allowing for burst read to speed a CAM seek and using burst write to push words, if necessary, to make room for newly added hash collisions. This is a marked improvement over prior art hash implementations that resolve hash collisions (i.e., when two keys hash to the same number) by providing pointers to an overflow space. This prior art process insures relatively long delays (e.g., 50 nanoseconds or longer for SDRAM) spent priming the row address on a DRAM for each pointer.

If, for a particular application, an identical match between the key presented and a stored key is not likely, the CAM engine may respond to the "seek (proximity match)" command from the host in implementing the seek function 152 of FIG. 1. In responding to this command, the CAM engine attempts to return the association of the record whose key is closest to the key presented by the host 104 in the table which currently has context. The CAM engine implements this proximity match feature to allow an entire table to be examined to identify the record which most closely resembles the key presented and to return the key's association from that record. When performing a proximity match, as many as fifty million keys can be examined for closeness in one second. This feature is designed to support real time artificial intelligence ("AI") recognition and learning applications.

The proximity match feature returns the association from 108 of the closest matching record in a table. The feature is executed by the CAM engine 100 when an exact match between the presented key and table records cannot be found. Besides AI applications, the proximity match feature is useful in image systems and other applications where inexact, or "fuzzy comparisons", are useful and suitable.

As this proximity match feature is implemented in a preferred exemplary embodiment of the present invention, the CAM engine supports two separate and distinct distance formulas. Either formula may be utilized to determine closeness of the presented key to stored keys. The first formula is a Manhattan distance formula, implemented as:

$$\Sigma |E_n - T_n|$$

The CAM engine also supports the following Euclidean distance formula:

$$\Sigma ((E_n - T_n)^2)^{1/2}$$

The CAM engine distance formulas operate on dynamic element boundaries. The chosen boundary applies to the entire key. However the boundary can be changed from search to search. The CAM engine supports 4, 8, 16 and 32-bit element boundaries.

Figure 10:
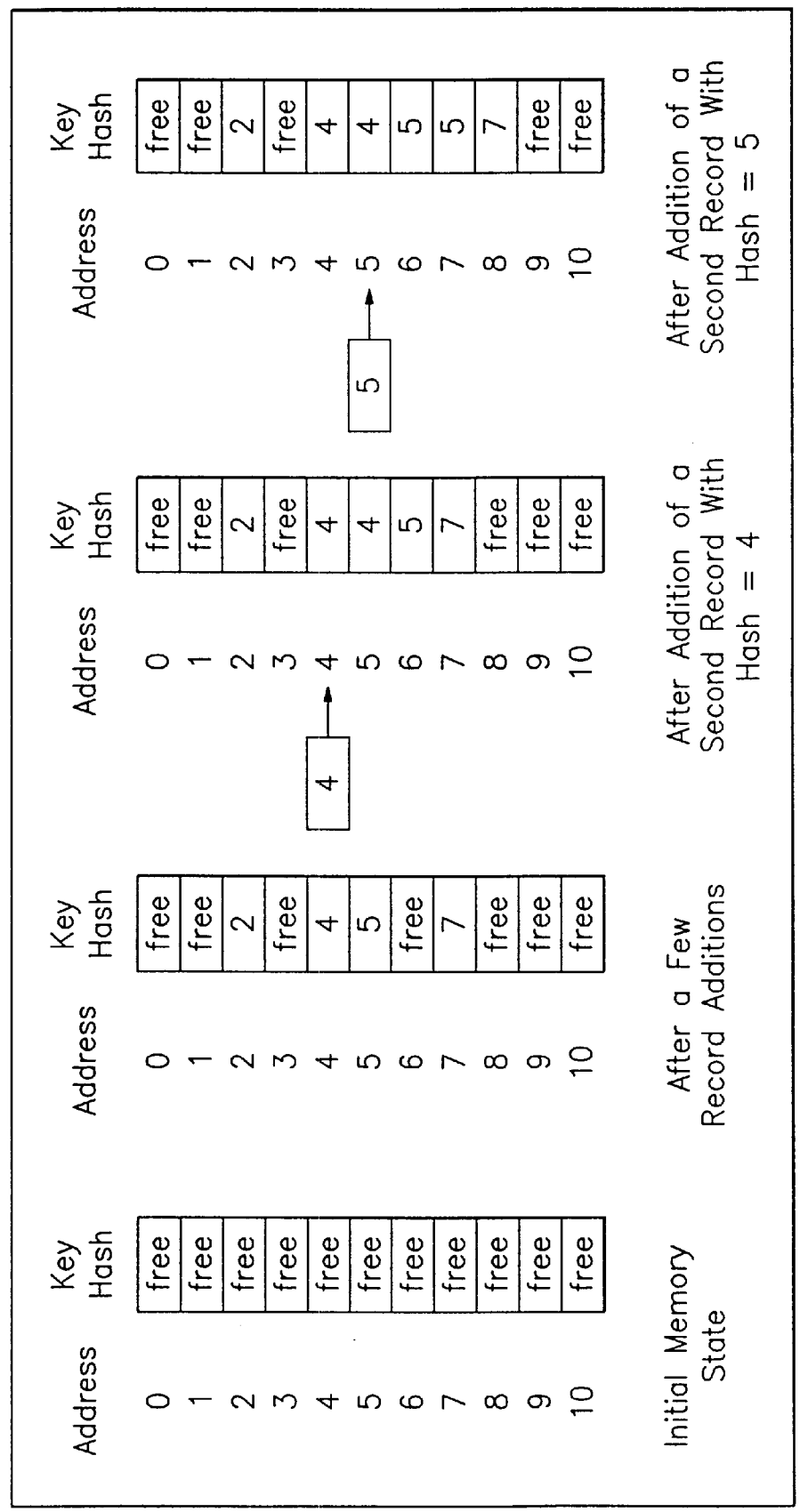
FIG. 10 illustrates an example of a record addition process implemented by the CAM engine of FIG. 1.

The CAM engine 100 responds to an "add record" command from the host 104 by adding a key and association, presented to the CAM engine by the host, to the table that currently has context. The add function 156 of FIG. 1 ensures that all keys are stored in hash sequence either in the word addressed by their hash code or in the next possible word following the hash address without preceding a key with a lower hash code. FIG. 10 illustrates an example of the record addition function.

Similar to the seek function 152 described above, the add function 156 utilizes several processes (e.g., SDRAM burst read) operating in parallel to provide optimum record addition performance. Generally, only the first read of the addition process and the first read of a page take more than one clock cycle per word. In embodiments in which the hashing is performed in one clock cycle per word, the only wait state occurs when SDRAM is used (as opposed to SRAM) and a page boundary is crossed. If this happens, control logic ensures that none of the parallel processes outruns the others.

In implementing this function, a variable KeyWord is set by the configuration function 144 and contains the number of 64-bit words that comprise the key. If this variable is zero, then no configuration has been established and the add process will invoke the executive function 148 of FIG. 1 to return an error. The parallel add process continues until either a free word is found or an end of hash heap condition is met. When either condition is met, all of the parallel processes are terminated.

The add function handles the null key (a key with all zero bits) by reserving record zero of the table for it. Upon the initial configuration of a table, the "configure new table" function zeros all words of the primary table area and stores a one in the last word of the first record of the table. This special initialization indicates that the first record is free. By reserving this location for the null key (whether or not one is ever added) the add module is able to distinguish the difference between a free word and a stored null key. If the key stored in the first record of the table is all zeros, then the null key has been stored there. If not, then the word is free for storage of the null key. Keys which hash to zero but are not null are given a hash result of one which keeps them from ever being stored in the special location reserved for the null key. The seek and delete functions have companion processes which set the hash of keys that hash to zero to one unless they are the null key. This special processing allows the CAM engine to accept null keys as valid keys.

Associations are stored in RAM 108 in different manners, depending on the configuration chosen and the features supported by the particular embodiment of the CAM engine 100 implemented, in light of the teachings herein. However, there are four basic association storage structures: (1) no association; (2) in embedded configurations where the association is stored in the high order portion and the key in the low order portion of the primary table words; (3) for relative association storage, keys and associations are stored in different memory tables at addresses which are the same relative distance from the beginning of the tables, taking the relative widths of the keys and associations into account. This storage reduces the number of reads to find a key and is especially useful for two bank configurations when the tables are in different banks; and (4) for extra wide associations, the associations will be stored in the individually allocated portions of the CAM memory with pointers from the key words.

The CAM engine 100 of the present invention responds to a "delete record" command from the host signal processor 104 by deleting the record stored in RAM 108 and referenced by the key presented by the host in the table that currently has context. The CAM engine invokes the delete function 160 of FIG. 1 by first performing a seek until the check for match process finds a match, or the check for no match process determines there is no match. If the latter condition occurs, an error is reported and the delete terminates. If a match is found, an upstream burst read/write is initiated to shuffle all appropriate keys up the width of the record to fill the hole created by the delete. Relative associations are handled in exactly the same manner. For linked associations, the association record is returned to the association free space.

Similar to the seek and add functions discussed above, the delete function utilizes the burst read capability of SDRAM or pipelined SRAM and the general parallel process arrangement. The parallel delete process continues until either the buffer is full or the end of the hash heap is found. If the buffer becomes full before the end of the hash heap is found, then context is recorded, the burst read is terminated, a burst read is initiated to write the buffer, context is reestablished, and the process begins again.

Besides the twelve exemplary write commands, described above, sent by the host signal processor 104 to the CAM engine 100, the CAM engine also responds to two read commands from the host. In response to a "read status" command, the CAM engine returns the current status of the output FIFO 136 to the host 104 on the data bus 1 16 and indicates if the command was successful and if there are data available to be read from the output FIFO. In response to a bread data" command, the CAM engine returns an output bus portion of the output FIFO.

The CAM engine 100 of the present invention has utility in vastly improving the performance of table-driven software applications that implement data storing, correlating and/or sorting operations. The CAM engine is a hardware solution that leverages the density and cost benefits of traditional RAM devices with the speed and intuitiveness of conventional CAM devices. The CAM engine also off-loads a significantly large amount of time the host signal .processor normally spends in performing table lookups. The CAM engine operates with dedicated memory, and its operation does not conflict with other memory cycles performed by the host signal processor. This reduces memory bottlenecks by eliminating the contention for the common memory bus.

The CAM engine finds applications in such areas as artificial intelligence, pattern recognition, image processing, robotics control, radar imaging, disk/database caching, communications networking, and generally in applications that perform arithmetic operations on large sets of data. The CAM engine is suitable for any application that requires very fast manipulation of large tables of data.

The CAM engine eliminates the need for specific software implementations to effectively transform RAM into CAM, and also eliminates the need for a custom ASIC for hardware implementations. The CAM engine allows for software centric systems that achieve performance levels previously only available with custom hardware applications. It is difficult to accurately quantify the speed advantages of the CAM engine as compared to a software-based RAM search algorithm, because of the large number of variables involved. However, it can be conservatively stated that the CAM engine of the present invention, with association matches of 100 nanoseconds or less can outperform a software lookup by at least an order of magnitude or better.

By driving a large bank of RAM (e.g., up to 256 gigabits), the CAM engine provides for direct memory access via keys rather than physical addresses, as in the conventional usage of RAM. Thus, the CAM engine provides for significant cost and scale advantages over conventional CAM memory devices, and provides dramatically superior performance when compared with existing database technology.

Software implementations of proximity matching or distance algorithms normally require numerous processor cycles and memory accesses for each key examined. In contrast, the CAM engine's proximity match feature allows the CAM engine, operating at 100 MHZ, to examine up to 50 million keys per second. This enables the CAM engine to significantly outperform a software distance algorithm. In doing so, the CAM engine also off loads a significant amount of processor tasks. For example, in a voice recognition application, instead of searching a sound signature database for the closest matching sound, the host processor can be processing the next sound wavelet while the CAM engine performs a proximity match on a previously computed signature.

The CAM engine of the present invention is also well-suited for high speed router applications where current CAM technology has been virtually abandoned because of price and size issues. In these communication applications, the CAM engine eliminates the need for specialized software or custom hardware solutions. The flexibility and speed of the CAM engine, together with the fact that it can be software driven, allows system designers the flexibility of software centric architectures with the speed of hardware solutions. Also, being allowed to choose between interfaced SRAM or SDRAM devices gives designers the ability to make speed/cost tradeoffs and to reuse portions of the design in environments with differing performance constraints.

Artificial intelligence learning systems can benefit greatly from the proximity match feature implemented by the CAM engine. Real time artificial intelligence and control systems, from decision support to robotics control systems, are rule based state machines. The CAM engine's ability to store multiple rule tables effectively provides such applications with a real time database. Many of the same benefits that general purpose databases provide for typical applications can be experienced by real time applications using the CAM engine of the present invention.

The benefits derived from traditional database caching to RAM can be greatly enhanced by caching to RAM-implemented CAM instead. Through use of flexibly-configured CAM tables implemented in large amounts of interfaced RAM, a database application can store the most recently used database keys and pointers in CAM tables and significantly improve performance when cached data are reused. When used in conjunction with traditional caching techniques, the architecture could be similar to level one and level two caching used by processors.

It should be understood by those skilled in the art that obvious structural modifications can be made without departing from the scope of the invention. Accordingly, reference should be made primarily to the accompanying claims, rather than the foregoing specification, to determine the scope of the invention.

Having thus described the invention, what is claimed is:

1. A method of storing a plurality of data records in a memory structure, wherein each data record has a key and a related association, the method comprising:

configuring a content addressable memory table in a random access memory device, wherein the content addressable memory table comprises storage for the plurality of keys and associations, and wherein the configuring comprises partitioning the content addressable memory table into a plurality of table records each having a table key;

initializing the content addressable memory table, the initializing comprising:

storing a first initialization value in the table key of the first table record; and storing a second initialization value in the table keys of all subsequent table records;

adding a plurality of data records to the content addressable memory table such that the data records are maintained in order according to hash values of the keys of the data records, the adding comprising:

calculating a hash value by applying a hash algorithm to the key of the data record to be stored; and if the table key at the location in the content addressable memory table which corresponds to the hash value contains the second initialization value, writing the data record into that location;

otherwise:

calculating a re-hash value by applying a hash algorithm to the key of the stored record at the location in the content addressable memory table which corresponds to the hash value;

comparing the re-hash value with the hash value; and if the re-hash value is greater than the hash value, pushing down any stored records between the next sequential table record with the second initialization value in its table key and the stored record with a table key which would hash to a value greater than the hash value, wherein said pushing down continues until said next sequential table record with the second initialization value in the table key is overwritten; and writing the data record into the table record at the location opened by pushing down the stored records;

otherwise:

reading the next sequential table record;

repeating the calculating a re-hash value, comparing the rehash value, and pushing down the stored records until the re-hash value is less than or equal to the hash; and writing the data record into the table record at the location opened by pushing down the stored records.

2. The method of claim 1, comprising calculating the re-hash value, comparing the re-hash value with the hash value, and reading the next sequential table record, in parallel.

3. The method of claim 1, further comprising retrieving a data record from the memory structure, the retrieving comprising:

calculating a presented hash value by applying a hash algorithm to a presented key;

reading, in address sequence, the keys stored in the content addressable memory table beginning at the address location which corresponds to the presented hash value;

checking for an exact match between the presented key and the stored key after each stored key is read; and continuing said reading and said checking until either the presented key matches the stored key, all address locations which correspond to the presented hash value have been read, or a table record with the second initialization value in the table key has been read.

4. The method of claim 3, comprising reading, checking for an exact match, determining whether all address locations which correspond to the presented hash value have been read, and determining whether a table record with the second initialization value in the table key has been read, in parallel.

5. The method of claim 1, further comprising retrieving a data record from the memory structure, the retrieving comprising:

reading, in address sequence, each key stored in the content addressable memory table;

comparing a presented key with the key stored in the content addressable memory table after each stored key is read, wherein said comparing includes applying a distance formula to the presented key and the stored key in order to determine the closest approximate match to a presented key; and returning the association corresponding to the stored key which is the closest approximate match to the presented key.

6. The method of claim 3, further comprising deleting a data record from the memory structure, the deleting comprising shuffling up all appropriate table keys until the stored key is overwritten if the presented key matches the stored key.

7. A memory controller comprising an integrated circuit including a means for storing a plurality of data records in a memory structure, wherein each data record has a key and a related association, the means for storing comprising:

means for configuring a content addressable memory table in a random access memory device, wherein the content addressable memory table comprises storage for the plurality of keys and associations, and the configuring comprises partitioning the content addressable memory table into a plurality of table records, each having a table key;

means for initializing the content addressable memory table, wherein the initializing comprises:
storing a first initialization value in the table key of the first table record; and
storing a second initialization value in the table keys of all subsequent table records;

means for adding a plurality of data records to the content addressable memory table such that the data records are maintained in order according to hash values of the keys of the data records, wherein the adding comprises:
calculating a hash value by applying a hash algorithm to the key of the data record to be stored; and
if the table key at the location in the content addressable memory table which corresponds to the hash value contains the second initialization value, writing the data record into that location;
otherwise:
calculating a re-hash value by applying a hash algorithm to the key of the stored record at the location in the content addressable memory table which corresponds to the hash value;
comparing the re-hash value with the hash value; and
if the re-hash value is greater than the hash value,
pushing down any stored records between the next sequential table record with the second initialization value in its table key and the stored record with a table key which would hash to a value greater than the hash value, wherein said pushing down continues until said next sequential table record with the second initialization value in the table key is overwritten, and
writing the data record into the table record at the location opened by pushing down the stored records,
otherwise:
reading the next sequential table record;
repeating the calculating a re-hash value, comparing the rehash value, and pushing down the stored records until the re-hash value is less than or equal to the hash; and
writing the data record into the table record at the location opened by pushing down the stored records.

8. The memory controller of claim 7, further comprising means for retrieving a data record from the memory structure, wherein the means for retrieving comprises:

means for calculating a presented hash value by applying a hash algorithm to a presented key;

means for reading, in address sequence, the keys stored in the content addressable memory table beginning at the address location which corresponds to the presented hash value;

means for checking for an exact match between the presented key and the stored key after each stored key is read; and means for continuing said reading and said checking until either the presented key matches the stored key, all address locations which correspond to the presented hash value have been read, or a table record with the second initialization value in the table key has been read.

9. The memory controller of claim 7, further comprising means for retrieving a data record from the memory structure, wherein the retrieving comprises:

means for reading, in address sequence, each key stored in the content addressable memory table;

means for comparing a presented key with the key stored in the content addressable memory table after each stored key is read, wherein said comparing includes applying a distance formula to the presented key and the stored key in order to determine the closest approximate match to a presented key; and means for returning the association corresponding to the stored key which is the closest approximate match to the presented key.

10. The memory controller of claim 8, further comprising means for deleting a data record from the memory structure, wherein the means for deleting comprises shuffling up all appropriate table keys until the stored key is overwritten if the presented key matches the stored key.

11. A method of storing a plurality of data records in a memory structure, wherein each data record has a key, the method comprising:

configuring a table in a random access memory device, wherein the table comprises storage for the plurality of keys, and wherein the configuring comprises partitioning the table into a plurality of table records each having a table key;

storing an initialization value in the table keys of a plurality of table records;

adding a plurality of data records to the table such that the data records are maintained in order according to hash values of the keys, the adding comprising:
calculating a hash value by applying a hash algorithm to the key of the data record to be stored; and
writing the data record into that location if the table key at the location in a content addressable memory table which corresponds to the hash value contains the initialization value.

12. The method of claim 11, further comprising retrieving a data record from the memory structure, the retrieving comprising:

calculating a presented hash value by applying a hash algorithm to a presented key;

reading, in address sequence, the keys stored in the table beginning at the address location which corresponds to the presented hash value;

checking for an exact match between the presented key and the stored key after each stored key is read; and continuing said reading and said checking until either the presented key matches the stored key, all address locations which correspond to the presented hash value have been read, or a table record with the initialization value in the table key has been read.

13. The method of claim 12, comprising reading, checking for an exact match, determining whether all address locations which correspond to the presented hash value have been read, and determining whether a table record with the initialization value in the table key has been read, in parallel.

14. The method of claim 11, further comprising retrieving a data record from the memory structure, the retrieving comprising:

reading, in address sequence, each key stored in the table;

comparing a presented key with the key stored in the table after each stored key is read, wherein said comparing includes applying a distance formula to the presented key and the stored key in order to determine the closest approximate match to a presented key; and returning an association corresponding to the stored key which is the closest approximate match to the presented key.

15. The method of claim 12, further comprising deleting a data record from the memory structure, the deleting comprising shuffling up all appropriate table keys until the stored key is overwritten if the presented key matches the stored key.

* * * * *